(12) United States Patent
Goldberg

(10) Patent No.: US 8,363,310 B2
(45) Date of Patent: Jan. 29, 2013

(54) HIGH POWER AND HIGH GAIN FIBER AMPLIFIER

(75) Inventor: Lew Goldberg, Fairfax, VA (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 407 days.

(21) Appl. No.: 12/773,112

(22) Filed: May 4, 2010

(65) Prior Publication Data

US 2011/0273764 A1 Nov. 10, 2011

(51) Int. Cl.
*H01S 4/00* (2006.01)
*G02B 6/26* (2006.01)

(52) U.S. Cl. .......... 359/341.32; 359/341.3; 385/32; 385/39; 385/48

(58) Field of Classification Search .......... 359/341.3, 359/341.32; 385/32, 39, 48, 126, 127
See application file for complete search history.

(56) References Cited

U.S. PATENT DOCUMENTS

| | | | |
|---|---|---|---|
| 4,815,079 A | 3/1989 | Snitzer et al. | |
| 4,938,556 A | 7/1990 | Digonnet et al. | |
| 5,406,411 A * | 4/1995 | Button et al. | 359/341.33 |
| 5,497,386 A * | 3/1996 | Fontana | 372/18 |
| 5,506,723 A * | 4/1996 | Junginger | 359/341.3 |
| 5,854,865 A | 12/1998 | Goldberg | |
| 5,864,644 A | 1/1999 | DiGiovanni et al. | |
| 5,930,030 A * | 7/1999 | Scifres | 359/341.3 |
| 5,999,673 A | 12/1999 | Valentin et al. | |
| 6,181,466 B1 * | 1/2001 | Franzoso et al. | 359/341.3 |
| 6,295,161 B1 * | 9/2001 | Bazzocchi | 359/341.33 |
| 6,388,806 B1 * | 5/2002 | Freeman et al. | 359/341.3 |
| 6,434,295 B1 * | 8/2002 | MacCormack et al. | 385/27 |
| 6,456,637 B1 * | 9/2002 | Holcomb et al. | 372/40 |
| 6,529,318 B1 * | 3/2003 | Kaneda et al. | 359/341.32 |
| 6,603,905 B1 * | 8/2003 | Ionov | 385/39 |
| 6,731,837 B2 * | 5/2004 | Goldberg et al. | 385/27 |
| 6,826,335 B1 * | 11/2004 | Grudinin et al. | 385/43 |
| 7,046,432 B2 * | 5/2006 | Starodoumov | 359/341.32 |
| 7,221,822 B2 * | 5/2007 | Grudinin et al. | 385/30 |
| 7,286,283 B2 * | 10/2007 | Starodoumov | 359/341.33 |
| 7,876,498 B1 * | 1/2011 | Honea et al. | 359/341.41 |
| 2004/0196537 A1 * | 10/2004 | Starodoumov | 359/341.3 |
| 2008/0130101 A1 * | 6/2008 | Kakui | 359/341.3 |
| 2009/0296745 A1 * | 12/2009 | Morse et al. | 372/6 |

OTHER PUBLICATIONS

Rosolem et al. "All Silica S-Band Double-Pass Erbium-Doped Fiber Amplifier", IEEE Photonics technology letters, vol. 17, No. 7, pp. 1399-1401 (Jul. 2005).*

* cited by examiner

*Primary Examiner* — Eric Bolda
(74) *Attorney, Agent, or Firm* — Richard J. Kim

(57) ABSTRACT

A device for amplifying optical signals propagating in optical fibers comprising a double cladding fiber amplifier having multiple gain stages, a port for coupling pump light into the double cladding fiber amplifier, and a double cladding fiber coupler for splitting the coupled pump light between the gain stages of the double cladding fiber amplifier. Also, a method for amplifying optical signals propagating in optical fibers comprising the steps of providing a double cladding fiber amplifier having multiple gain stages, coupling pump light into the double cladding fiber amplifier, and splitting the coupled pump light between the gain stages of the double cladding fiber amplifier.

16 Claims, 5 Drawing Sheets

HIGH POWER AND HIGH GAIN FIBER AMPLIFIER

GOVERNMENT INTEREST

The invention described herein may be manufactured, used, sold, imported, and/or licensed by or for the Government of the United States of America.

FIELD OF THE INVENTION

This invention relates in general to fiber optic devices, and more particularly to optical fiber amplifiers.

BACKGROUND OF THE INVENTION

In the past, multi-stage amplifiers have been used to achieve the high optical signal gain needed to amplify signals propagating in optical fibers. In a single stage optical amplifier, the overall optical signal gain is limited by the buildup of amplified spontaneous emission which clamps the maximum population inversion that can be achieved in the active dopant in the fiber core (typically Er, Yb, Er/Yb, Nd, Tm). The buildup of amplified spontaneous emission can be suppressed by placing several elements between the amplification stages. These include optical isolators to eliminate backward propagating amplified spontaneous emission, narrow-band spectral filters to eliminate most of the broad-band amplified spontaneous emission, and polarizers which block one-half of the unpolarized amplified spontaneous emission. In addition, for amplification of optical pulses, optical switches or "gates" can be placed between the stages. These gates are operated so as to have a high transmission state when a pulse is propagating through the amplifier, and to have a low transmission state in the time between pulses. This prevents the buildup of amplified spontaneous emission power in the time between pulses, resulting in a substantial decrease in the average amplified spontaneous emission power generated by the amplifier.

Multi-stage, core-pumped (where the pump light is directly injected into the fiber core using a fused fiber wavelength division multiplexer, as described in U.S. Pat. No. 4,938,556 to Digonnet et al., wavelength-division multiplexer-optical amplifiers) can be constructed using a separate pump source (typically a 980 nm laser diode pigtailed with a single mode fiber pumping an Er-doped fiber core) to pump each stage. Since the fiber-coupled pump diode is one of the most expensive components in a fiber amplifier, in order to decrease the overall amplifier cost and complexity, it is desirable to use a single pump diode and split the pump signal into multiple single mode fibers using a single mode fiber coupler/splitter. Each of these multiple pump fibers can then be used to supply pump power to different amplifier stages. Alternately, remnant pump light that is unabsorbed after the first amplification stage can be coupled out of the fiber core using a wavelength division multiplexer fiber coupler, allowed to bypass the isolator or other inter-stage optical elements, and then re-injected using a second wavelength-division multiplexer into another amplification stage.

The drawback of the multi-stage amplifier configuration pumped by a single mode fiber pigtailed pump diode is that the pump power available from these sources is typically limited to <400 mW. Such low available pump power limits the maximum gain and output power that can be achieved in a multi-stage amplifier pumped by a single mode fiber pigtailed pump.

To increase the amplifier output power, double cladding fibers with active doped cores can be used, as described in U.S. Pat. No. 4,815,079 to Snitzer et al. The double cladding fiber consists of a low refractive index outer cladding surrounding a higher index inner cladding (typically 50-500 μm diameter) for guiding the pump light, and a yet higher index core (typically 5-25 μm diameter) for guiding the signal light. Since inner cladding of the double cladding fibers constitutes a large multimode waveguide for the pump light, broad area laser diodes with wide emission region (50-200 μm), allowing high output power (5-10 W), can be used as the pump source.

The prior art includes many ways of injecting pump light into the double cladding fiber. These include (1) optical couplers based on optical contact between two fibers (described in U.S. Pat. No. 4,815,079 to Snitzer et al.), (2) micro-prisms (described in U.S. Pat. No. 4,815,079 to Snitzer et al.), (3) tapered fiber bundles (described in U.S. Pat. No. 5,864,644 to DiGiovanni et al.), (4) v-groove side-pumping (described in U.S. Pat. No. 5,854,865 to Goldberg), (5) fused tapered fiber pump fibers (described in U.S. Pat. No. 5,999,673 to Valentin et al.), (6) multiple-fiber fiber cables (described in U.S. Pat. No. 6,826,335 to Grudinin et. al.), and (7) 3-fiber double cladding fiber couplers (described in U.S. Pat. No. 6,434,295 to MacCormack et al.). These methods are designed to achieve near-complete transfer of the pump power from the pump diode into the doped double cladding fiber. To make a multi-stage amplifier, references (2)-(6) require use of multiple separate pump couplers, each pumping a corresponding gain stage of the multi-stage amplifier. This increases the overall amplifier cost and complexity. Methods described in reference (7) can be used to make a multi-stage amplifier if more than one double cladding fiber is in contact with the pump fiber. However, this method requires the fabrication of a complex multi-fiber cable. Reference (7) uses a 3-fiber coupler consisting of a multimode pump fiber and two double cladding fibers. The cladding of all fibers are fused together to allow transfer of the pump light from the multimode pump fiber into the claddings of the double cladding fibers. Equal amounts of pump power are coupled into the two pump fibers and no method is described for coupling different amounts of power into the double cladding fibers. Other deficiencies are that it uses 3 fibers instead of 2 fibers, and it does not describe how to construct a multi-stage amplifier using a single coupler.

SUMMARY OF THE INVENTION

It is therefore an object of this invention to construct a simple high gain and high power multi-stage amplifier based on double cladding fibers. This and other objects of the invention are achieved in one aspect by a device for amplifying optical signals propagating in optical fibers comprising a double cladding fiber amplifier having multiple gain stages, means for coupling pump light into the double cladding fiber amplifier, and means for splitting the coupled pump light between the gain stages of the double cladding fiber amplifier.

Another aspect of the invention involves a method of amplifying optical signals propagating in optical fibers comprising the steps of providing a double cladding amplifier having multiple gain stages, coupling pump light into the double cladding fiber amplifier, and i splitting the coupled pump light between the gain stages of the double cladding fiber amplifier.

The invention uses a simple 2-stage amplifier structure that relies on a single 2×2 double cladding fiber coupler. The coupler design allows uneven splitting of the pump power between the two coupler fibers and makes it possible to transfer most of the pump power from one fiber into the second fiber. The 2-stage amplifier uses a single, high power pump diode to pump both gain stages, with pump power apportioned optimally between the stages. The configuration achieves high gain, high efficiency and high output power with minimum number of components, thereby minimizing amplifier complexity, size, and cost. Since the pump diode is typically the highest cost component in a fiber amplifier, the use of a single high power broad area pump diode to pump both amplifier stages makes it possible to achieve high amplifier gain concurrently with high average output. Since different double cladding fibers can be used in the two amplification stages, each double cladding fiber can be chosen to optimize the operation of the particular gain stage. Other techniques that utilize double cladding fiber couplers require use of multiple couplers to assemble a multi-stage fiber amplifier, and therefore are more complex and costly to fabricate.

Additional advantages and features will become apparent as the subject invention becomes better understood by reference to the following detailed description when considered in conjunction with the accompanying drawings.

DETAILED DESCRIPTION

Figure 1:
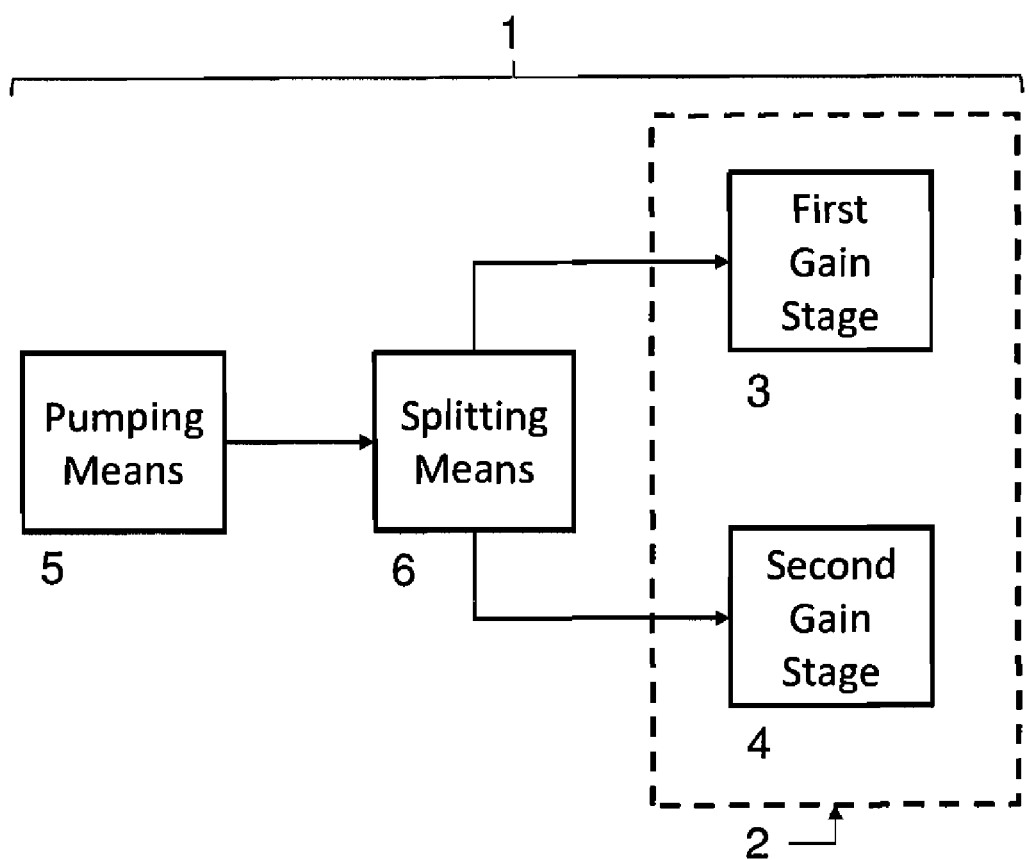
FIG. 1 is a block diagram of the device for amplifying signals propagating in optical fibers.

Referring now to the drawings, where like reference numerals designate identical or corresponding parts, FIG. 1 is a block diagram of the device 1 for amplifying signals propagating in optical fibers in accordance with the invention. The amplifying device comprises a double cladding fiber amplifier 2 having two gain stages 3 and 4, pumping means 5 for coupling pump light into the double cladding fiber amplifier, and splitting means 6 for splitting the coupled pump light 14 between the two gain stages of the double cladding fiber amplifier.

While the splitting means 6 may take a variety of forms, conveniently it may take the form shown in FIG. 2 of a fiber coupler 7 made up of two double cladding fibers 8 and 9. The two double cladding fibers are fused together in the coupling region 13 or are in optical contact with each other to allow power transfer to occur from one cladding into the other. The fiber coupler 7 is fabricated so that a sufficiently strong optical coupling is achieved between the inner claddings 12 of the two fibers 8 and 9, without causing a significant perturbation of signal light propagating in the cores 11 of the fibers. This way, there is no significant loss for the signal light propagating in either one of the fibers.

Figure 2A:
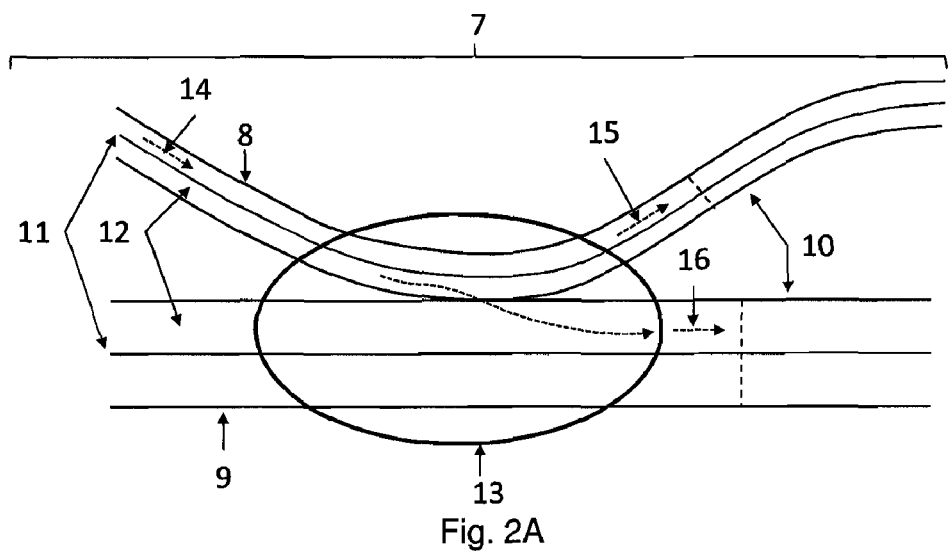
FIG. 2A shows a fiber coupler with splitting means.
Figure 2B:
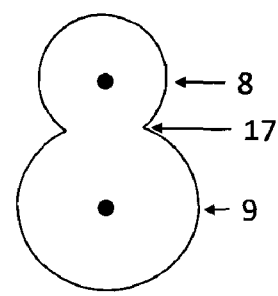
FIG. 2B shows a coupler cross section.

FIG. 2B shows a coupler cross section 17 including double cladding fibers 8 and 9.

For a sufficiently long coupling region (i.e., the length over which light can couple between the fibers), the powers coupled into the multimode inner claddings of the double cladding fibers 8 and 9 are given by the ratio:

$$P_1 P_2 = A_1/A_2$$

where $A_1$ is the inner cladding area of fiber 8, $A_2$ is the inner cladding area of fiber 9, $P_1$ 15 is the power coupled into fiber 8 and $P_2$ 16 is the power coupled into fiber 9. The power split ratio can be adjusted by using fibers with different inner cladding areas. For a lossless coupler, the total power is conserved:

$$P_1 + P_2 = P,$$

where P 14 is the power propagating in fiber 8 before reaching the coupler.

The fraction of the total power that cross-couples from fiber 8 into fiber 9 is given by:

$$P_2/P = A_2/(A_1 + A_2),$$

while the fraction of total power that remains in fiber 8 is given by:

$$P_1/P = A_1/(A_1 + A_2).$$

The double cladding fibers contain a core 11 for signal propagation. This core can be passive (no active dopant and no pump absorption), or it can be doped with an active dopant such as Er/Er/Yb, Yb, Nd, Tm to achieve pump absorption and optical amplification. For the case of a passive core, in order to achieve optical gain, the coupler fiber ends can be later fusion spliced to double cladding fibers 10 that contain a doped core. By proper matching of inner cladding sizes 12 and core sizes 11 as well as their numerical apertures, efficient power transfer for the signal light and pump light between the undoped double cladding gain fibers (DCFs) and doped DCF can be achieved.

As explained, the use of double cladding fibers with different inner cladding areas provides a means for controlling the pump powers split ratio. However, this method has some limitations. In order to transfer or cross-couple a large fraction of power out of fiber 8 and into fiber 9, the cladding area $A_1$ of fiber 8 needs to be significantly smaller than cladding area $A_2$ of fiber 9. For example, assuming a 125 μm diameter of fiber 9 (round inner cladding shape), a fiber 8 diameter of 82 μm would be required to cross-couple 70% of the power from fiber 8 into fiber 9. This corresponds to a cladding area ratio of $A_2/A_1 = 2.3$. Even smaller fiber 8 diameters would be required to achieve higher cross-coupling fractions; a fiber 8 diameter of 63 μm would be required (corresponding to area ratio of $A_2/A_1 = 4$) to cross-couple 80% of the power from fiber 8 into fiber 9, and a fiber 8 diameter of 42 μm (corresponding to area ratio of $A_2/A_1 = 9$) to cross-couple 90% of the power from fiber 8 into fiber 9. Fibers with such small cladding diameters are difficult to fabricate, handle, cleave and fusion splice, making such design difficult to implement. In addition, the small fiber size will limit the size of the broad area laser active region that can be efficiently coupled into the fiber, and therefore limit the amount of pump power that can be coupled into the fiber.

Figure 3:
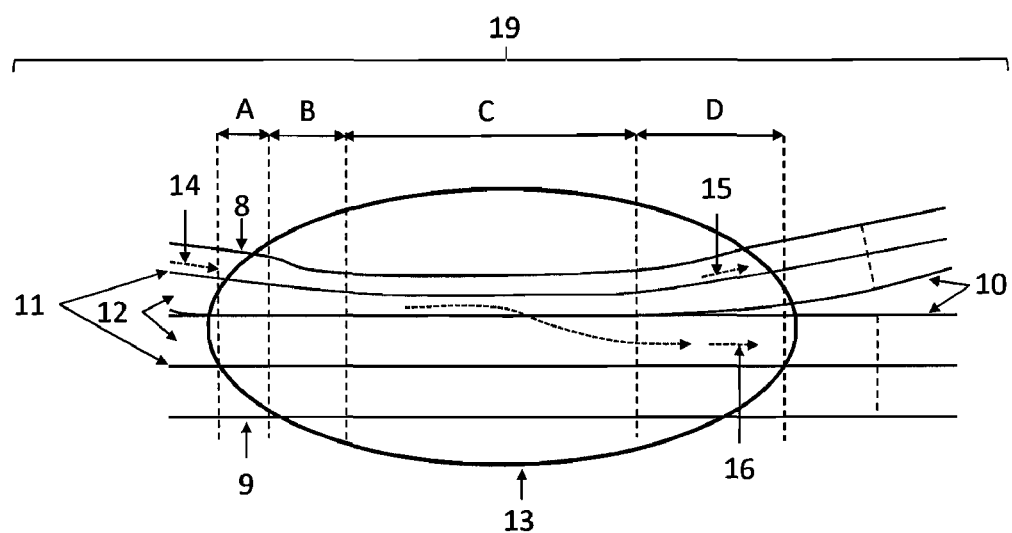
FIG. 3 shows another fiber coupler with splitting means.

To circumvent these deficiencies associated with the use of small diameter fibers, the splitting means 6 may take the form of a double cladding fiber coupler 13 shown in FIG. 3. In this configuration, before the fiber coupler is fabricated by fusing the two fibers, as disclosed in U.S. Pat. No. 5,999,673 to Gapontsev et al., whose disclosure is incorporated by reference, the pump delivery fiber 8 is gradually tapered down to a diameter required to achieve a specific cross-coupling ratio. Outside the coupling region, both fibers can have a larger diameter for easy handling and coupling of a broad area laser diode pump, typically 125-250 μm. The fiber coupler 7 shown in FIG. 3 consists of 4 distinct sections labeled A, B, C and D. In section A, the un-tapered fiber 8 is fused to fiber 9 in order to achieve coupling of light from fiber 8 into fiber 9. As explained in U.S. Pat. No. 5,999,673, extending the fused and coupling region to encompass the un-tapered fiber 8 section allows the total area of the fused fibers to be always larger that the area of the un-tapered fiber 8, assuring that pump light always remains at sufficiently low numerical aperture to be guided in the fibers. The fused fiber coupling region 13 continues through section B containing the fiber 8 down-taper, and then through section C that follows this down-taper. In section C, the fiber 8 diameter has a reduced cross-sectional area in order to achieve a high (preferably >50%) cross-coupling fraction, as explained above. Fibers 8 and 9 are separated in section D before reaching the up-taper, and remain separated for the remainder of the coupler length. This feature, comprising section D, is an important part of the splitting means 6 design since it prevents light that is already in fiber 9 from back-coupling into fiber 9. If the two fibers were allowed to remain fused in section D, the cross-coupling ratio for the coupler would be determined by the area of the un-tapered fibers, as it was in the embodiment of the splitting means shown in FIG. 2A.

Figure 4:
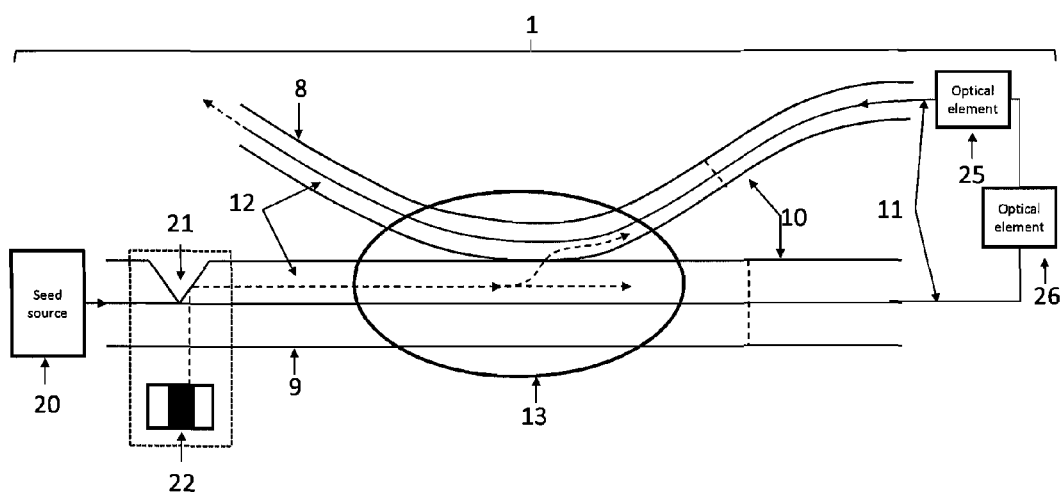
FIG. 4 shows one embodiment of the device for amplifying signals propagating in optical fibers.

FIG. 4 shows one embodiment of the device 1 for amplifying signals propagating in optical fibers. In this embodiment, the seed signal generated by a seed source 20, such as a low power laser for example, preferably a laser diode, is coupled into the core of a double cladding fiber, then propagates unperturbed past a v-groove 21 that is cut into the fiber cladding to allow pump light from a pumping laser diode 22 to be side-injected into the cladding, as disclosed in U.S. Pat. No. 5,854,865 to Goldberg, whose disclosure is incorporated by reference. The v-groove 21 does not penetrate into the fiber core and therefore does not introduce any loss for the light propagating in the fiber core. After the signal propagates through a double cladding coupler 13 as shown in FIG. 2A, it is amplified in the doped core of the double cladding that is fiber fusion spliced to one end of the coupler. This doped fiber section, sufficiently long to absorb a substantial fraction of pump light coupled into it, constitutes the first (pre-amplifier) gain stage 3 of the two stage amplifier 2. In the embodiment shown, the pump light propagates (co-propagates) in the same direction as the signal. Such co-pumped arrangement of the first amplifier stage minimizes the amplified spontaneous emission and amplified signal intensity noise at the amplifier 2 output.

After amplification in the first gain stage 3, the signal propagates through various optical components shown as elements 25 and 26, such as optical isolators, spectral filters and intensity modulators that are typically used in a multi-stage amplifier to block backward amplified spontaneous emission, reduce amplified spontaneous emission power injected into the subsequent amplification stages, or gate the signal. These components are required to reduce the effects of forward and backward propagating amplified spontaneous emission that would otherwise limit the total signal gain in the amplifier. Since seed signal power 20 is typically low (10-50 mW from a laser diode), very high amplifier gain is required when generation of high peak power (multi-kW) pulses is required.

After propagating through the various inter-stage optical elements 25 and 26, the signal enters a second section of doped double cladding fiber, fusion spliced to the coupler 13. This section, sufficiently long to absorb a substantial fraction of the pump light that enters it, constitutes the second gain stage 4 of the amplifier. The signal is amplified further in the second amplifier stage, then propagates through the coupler 13 and is emitted from the remaining free port of the coupler. In this amplification stage, the pump light propagates in the opposite direction (counter-propagating) to the signal in order to maximize the power extraction and amplifier output power. The co-pumped first stage and counter-pumped second stage arrangement of FIG. 4 is shown for illustrative purposes only, and both stages can be either co-pumped or counter-pumped. A two gain stage amplifier architecture that includes amplified spontaneous emission blocking filters, isolators and modulators between the two stages achieves much higher signal gain than possible with a single gain stage. Sharing of the pump power generated by a single high power broad area laser diode by the two gain stages, made possible by the double cladding coupler, simplifies the amplifier construction and reduces the total amplifier cost.

As already described, the fraction of the light coupled from the first gain stage double cladding fiber into the second gain stage double cladding fiber can be controlled by appropriate selection of fiber cladding areas in the coupling region. Typically, the fraction of pump power used in the first stage will be <50% and fraction used for pumping the second stage will be >50%. This allows most of the pump power to be used in the final (power) amplification stage as required to maximize high average output power and pump power-to-amplified power conversion efficiency.

In addition to enabling different apportionment of the pump power between the two gain stages, the double cladding coupler also allows the use of double cladding fibers with different core and cladding diameters for the two stages. For example, a fiber with a small doped core might be preferred in the first stage to maximize gain at low pump powers, while a large core can be used in the second stage to minimize non-linear effects, such as self-phase modulation, four wave mixing and Stimulated Brillouin Scattering (SBS). Large core also increases pump absorption in the inner cladding allowing the use of shorter double cladding fiber section, also resulting in a reduction of non-linear effects in the second gain stage. These factors are particularly important when amplifying low duty cycle pulses that result in high peak powers at the amplifier output.

Figure 5:
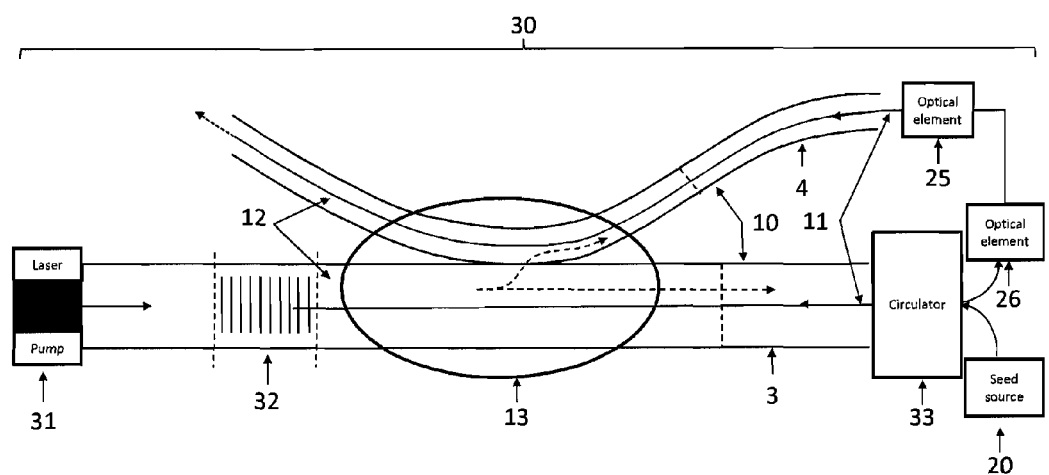
FIG. 5 shows another embodiment of the device for amplifying signals propagating in optical fibers.

FIG. 5 shows another embodiment of the device 1 for amplifying weak signals propagating in optical fibers. This embodiment is comprised of the double cladding coupler 13, a 3-port optical circulator 33, for example, JSDU Corporation part number CIR-330011000, inter-stage optical elements 25 and 26, a fiber Bragg grating 32 that is highly reflective at the signal wavelength and that is fabricated in the core of the double cladding fiber, and a fiber-coupled laser diode pump 31. Pump light is coupled directly into the coupler 13 by fusion splicing the pump diode 31 pigtail to the double cladding fiber containing the fiber Bragg grating 32, then splicing that fiber to one of the coupler fibers. Alternatively, the fiber Bragg grating 32 can be directly fabricated into one end of the coupler 13 fibers. The pump light propagates undisturbed through the fiber Bragg grating 32 section and enters the coupling region of the double cladding fiber coupler 13. The first gain stage 3 of the amplifier 2 functions as a double pass amplifier.

The signal from the seed source 20 enters one port of the 3-port optical circulator 33, exits the second circulator port and is injected into the doped core of the double cladding fiber of the first gain stage 3 of the amplifier 2. The signal is amplified the first time as it propagates through the double cladding fiber, then passes through the double cladding coupler 13, and is reflected by the fiber Bragg grating 32. After reflection by the fiber Bragg grating 32, the signal passes again through the coupler 13 and is amplified a second time as it propagates through the same section of doped double cladding fiber of the first gain stage 3. After this second pass through the doped double cladding fiber, the amplified signal enters the second port of the circulator 33, and is out-coupled through the third circulator port. Then, the signal propagates through the inter-stage elements 25 and 26 and enters the doped double cladding second gain stage 4 of the amplifier 2. For the counter-pumped arrangement shown in FIG. 5, the amplified signal exits directly out of the coupler 13 output pigtail.

In conclusion, the invention makes it possible to construct a simple and high power multi-stage fiber amplifier based on double cladding fibers. It allows the use of a single high power broad area laser diode pump and a special double cladding fiber pump coupler to distribute the pump power between multiple gain stages. The simple amplifier configuration and low parts-count of the device makes it possible to minimize the overall package size and amplifier cost.

It is obvious that many modifications and variations of the present invention are possible in light of the above teachings. It is therefore to be understood that within the scope of the appended claims, the invention may be practiced otherwise than as described.

What is claimed is:

1. A device for amplifying signals propagating in optical fibers comprising:
   a double cladding fiber amplifier having multiple gain stages, at least one optical circulator being interposed between two of the multiple gain stages;
   a laser pump for coupling pump light into the double cladding fiber amplifier; and
   a fiber coupler for splitting the coupled pump light between the gain stages of the double cladding fiber amplifier.

2. The device recited in claim 1 wherein the laser pump includes a v-groove coupled pump laser diode.

3. The device recited in claim 1 wherein the laser pump includes a fiber-coupled pump laser diode.

4. The device recited in claim 1 wherein a fiber Bragg grating is disposed in the core of a double cladding fiber.

5. The device recited in claim 1 wherein the fiber coupler includes a double cladding fiber coupler.

6. The device recited in claim 1 wherein each of the gain stages of the amplifier includes a length of doped double cladding gain fiber.

7. The device recited in claim 1, further comprising an optical isolator.

8. The device recited in claim 1, further comprising an optical intensity modulator.

9. The device recited in claim 1, further comprising a spectral filter.

10. A device for amplifying signals propagating in optical fibers comprising:
    a double cladding fiber amplifier having two gain stages, and a plurality of optical elements interposed between the two gain stages, each of the gain stages including a length of doped double cladding gain fiber, an optical circulator being interposed between the two gain stages;
    a laser pump coupled to pump light into the double cladding fiber amplifier; and
    a fiber coupler for splitting the coupled pump light between the two gain stages of the double cladding fiber amplifier,
    wherein the fiber coupler includes a double cladding fiber coupler.

11. A method of amplifying optical signals propagating in optical fibers comprising the steps of:
    providing a double cladding fiber amplifier having multiple gain stages, at least one optical circulator being interposed between two of the multiple gain stages;
    coupling pump light into the double cladding fiber amplifier; and
    splitting the coupled pump light between the gain stages of the double cladding fiber amplifier.

12. The method recited in claim 11 wherein a v-groove is cut into the fiber cladding to allow the pump light to be injected into the cladding.

13. The method recited in claim 11 wherein the splitting is accomplished by a double cladding fiber coupler.

14. The method recited in claim 11 wherein an optical isolator is interposed as an interstage element.

15. The method recited in claim 11 wherein an optical intensity modulator is interposed as an interstage element.

16. The method recited in claim 11 wherein a spectral filter is interposed as an interstage element.

* * * * *